(12) United States Patent
McCorkle

(10) Patent No.: US 8,390,344 B2
(45) Date of Patent: Mar. 5, 2013

(54) METHOD AND CIRCUIT FOR WAVEFORM GENERATION

(76) Inventor: John W. McCorkle, Vienna, VA (US)

( * ) Notice: Subject to any disclaimer, the term of this patent is extended or adjusted under 35 U.S.C. 154(b) by 117 days.

(21) Appl. No.: 13/076,996

(22) Filed: Mar. 31, 2011

(65) Prior Publication Data

US 2012/0274368 A1 Nov. 1, 2012

Related U.S. Application Data

(60) Provisional application No. 61/322,232, filed on Apr. 8, 2010.

(51) Int. Cl.
*H03B 19/00* (2006.01)

(52) U.S. Cl. .......................... 327/119; 327/116

(58) Field of Classification Search .............. 327/116, 327/119–123
See application file for complete search history.

(56) References Cited

U.S. PATENT DOCUMENTS 7,302,248 B2 * 11/2007 Craninckx ............ 455/302

\* cited by examiner

*Primary Examiner* — Lincoln Donovan
*Assistant Examiner* — William Hernandez
(74) *Attorney, Agent, or Firm* — Posz Law Group, PLC

(57) ABSTRACT

A programmable waveform generator, comprising: a controllable waveform generator configured to generate an initial bandwidth signal having an initial frequency bandwidth; a tone generator configured to generate a plurality of tone signals, each tone signal having a different frequency; a first bandwidth-multiplying circuit, including a first mixer having a first input port configured to receive the low-bandwidth signal; a first switch configured to choose one of the plurality of tone signals or a phase shifted version of one of the plurality of tone signals and output the chosen signal as a first chosen tone; a controller configured to control the operation of the bandwidth multiplying block, wherein the first mixer is further configured to receive the first chosen tone at a second input port, wherein the first mixer is further configured to mix the initial bandwidth signal and the first chosen tone to generate a first bandwidth signal at an output port, the first bandwidth signal having a first frequency bandwidth, wherein the first frequency bandwidth is greater than the initial frequency bandwidth, and wherein the first frequency bandwidth is an integer multiple of the initial frequency bandwidth.

13 Claims, 9 Drawing Sheets

| State | Chosen Frequency on $I^{th}$ Multiplying Circuit | | |
|---|---|---|---|
| | 1st | 2nd | 3rd |
| A | $T_{1,1}$ | $T_{2,1}$ | $T_{3,1}$ |
| B | $T_{1,2}$ | $T_{2,1}$ | $T_{3,1}$ |
| C | $T_{1,1}$ | $T_{2,2}$ | $T_{3,1}$ |
| D | $T_{1,2}$ | $T_{2,2}$ | $T_{3,1}$ |
| E | $T_{1,1}$ | $T_{2,1}$ | $T_{3,2}$ |
| F | $T_{1,2}$ | $T_{2,1}$ | $T_{3,2}$ |
| G | $T_{1,1}$ | $T_{2,2}$ | $T_{3,2}$ |
| H | $T_{1,2}$ | $T_{2,2}$ | $T_{3,2}$ |
| ⋮ | ⋮ | ⋮ | ⋮ |

FIG. 12

METHOD AND CIRCUIT FOR WAVEFORM GENERATION

CROSS-REFERENCE TO RELATED PATENT DOCUMENTS

This application relies for priority on U.S. provisional application Ser. No. 61/322,232, by John W. McCorkle, filed 8 Apr. 2010, entitled "METHOD AND CIRCUIT FOR WAVEFORM GENERATION," the contents of which is hereby incorporated by reference in its entirety.

FIELD OF THE INVENTION

The disclosed circuitry relates to applications such as radar (RAdio Detection And Ranging), ladar (LAser Detection And Ranging), sonar, radio transmitters, radio receivers, and instrumentation such as spectrum analyzers, network analyzers. All of these applications require, high quality, signal generators that are able to switch a new frequency across wide bandwidths, and settle extremely quickly to a new extremely stable low-drift low-phase-noise frequency. In addition, the signal generators used in these applications are required to accurately sweep across a wide frequency range. This application relates high accuracy, low noise, small footprint, fast-settling, wide bandwidth signal generators.

BACKGROUND OF THE INVENTION

Signal generators take many forms, from (a) a basic analog oscillator circuit that oscillates at a frequency governed by an RC (resistor capacitor) network, or the resonance of an LC (inductor-capacitor) circuit or the resonance or delay of devices such a SAW (surface acoustic wave) device, or a crystal, or a dielectric resonator, or BAW (bulk acoustic wave) device, etc., to (b) an analog oscillator followed by a non-linear stage that generates a harmonic term that is isolated by a filter to serve as the output tone, to (c) a combination of analog and digital circuits that may lock a higher frequency oscillator with poor long term stability but good short term stability, to a low frequency oscillator with good long term stability, but poor short term stability, such as phase-locked-loop (PLL), to (d) an NCO (numerically controlled oscillator) that is formed by driving a DAC (digital to analog converter) with data that causes the DAC to produce the desired output signal. Each method results in different sets of advantages and disadvantages in terms of metrics such as size, cost, weight, power consumption, settling time after a frequency change, modulation bandwidth, modulation linearity, long and short term stability, harmonic levels, spurious levels, and flexibility or ease of control.

Numerically controlled oscillators are well known to achieve optimally fast (short) settling times. At the same time, due to a combination of their discrete-time digitally-sampled stair-step output waveform, and the fact that the stair-step output levels must settle in each time-step period, an NCO cannot be clocked fast enough to produce the bandwidth required by many applications. It is an objective of this disclosure to show a method of obtaining arbitrarily large bandwidths.

Many applications are extremely sensitive to spurious signals. Applications such as radar, ladar (LAser Detection And Ranging), sonar, and numerous instrumentation applications, are fundamentally limited by the SFDR of the signals they generate and use to perform their function. The limit follows from the fact that they rely on correlations on these signals. Harmonic and spurious signals correlate along with the desired signal, causing an error in the measured correlation, which is supposed to only come from the desired signal.

One method of extending the bandwidth of an NCO is to use a frequency multiplier. This can be done using common mixer circuits or by using a circuit that generates harmonics and then filtering out all the harmonics that are undesired. This method results in a high noise floor and is unsuitable for many applications. Additionally, if the initial waveform was a complex waveform with, for example, a desired spectral notch, the multiplication process would destroy the notch. Another objective of this disclosure is to extend the bandwidth yet maintain a low noise floor, and preserve characteristics like spectral notches in the initial waveform.

Another method of extending the bandwidth of an NCO is to use a mixer together with a large N-way switch network and family of N tones spaced in frequency by the bandwidth (B) of the NCO. The switch network selects the desired tone and the NCO output signal is shifted in frequency by the frequency of the selected tone. In this way, the bandwidth covered by the output signal is N times the bandwidth of the NCO. This method results in a high power and a physically large and costly system that is incompatible with many applications. Another objective of this disclosure is to extend the bandwidth, yet at low power, a small footprint, and at relatively low cost.

Another method of extending the bandwidth of an NCO is a variant of the above paragraph, where the set of N oscillators is replaced by one or a smaller number of PLL synthesizers which are capable of being commanded to generate the N needed frequencies. The relatively slow switching speed of the PLL's in this solution, however, makes it unsuitable for many applications. It also prevents the system from continuously sweeping across the extended bandwidth since the PLL settling time is so long. Another objective of this disclosure is to extend the bandwidth at low power and small footprint, and with the capability to sweep the entire extended bandwidth continuously, and with optimally fast hopping or switching speed.

SUMMARY OF THE INVENTION

The disclosed apparatus uses small, inexpensive, low-power hardware to generate an initial signal spanning a narrow frequency range, with high controllability and extremely fast settling time to a an extremely stable state with low-phase noise and drift. One way to accomplish this is employing a direct digital synthesizer (DDS); another way is storing a complex pre-computed waveform in random access memory (RAM) and using a digital to analog converter (DAC) to generate the initial signal. The disclosed circuit then uses a relatively small number of additional parts to make a relatively small number of tones and relatively simple switch and mixer network to operate on the initial signal so as to produce an output signal covering a much wider frequency range with nearly equally fast settling time, high controllability, and low phase noise, as the initial source signal.

These additional parts extend the frequency range through a binary tree arrangement in order to minimize parts count. The binary tree is arranged, using high-side and low-side mixer injection to allow transitions between the tones to result in an output without transients. The combination of the binary tree and the specific frequencies chosen for the tones, and the arrangement of high and low side injection allows the entire output frequency range to be swept continuously without requiring any abrupt frequency changes from the initial signal generator. Since transients that cause filters to ring and not settle quickly are avoided, it also allows the hopping speed of the initial signal generator to be maintained across the entire extended output frequency range. By not requiring the initial signal to be multiplied, the controllability and low phase noise of the initial signal generator is maintained across the entire extended output frequency range.

Normally, an oscillator must be added every time the one extends the bandwidth by the bandwidth of the initial signal. For example, if the bandwidth of the initial signal was 100 MHz and the desired output bandwidth was 6.4 GHz, it would take 64 oscillators. Using the disclosed binary tree arrangement, every time a pair of oscillators is added, the output bandwidth is doubled. Using the disclosed method, the same 100 MHz initial bandwidth can be expanded to cover 6.4 GHz of bandwidth with only 12 oscillators. In general, if the ratio of output bandwidth to input bandwidth is $2^N$, then there is a factor of $2^N/(2 \log_2(N))$ reduction in the number of tones that must be generated and managed in a switching network. This reduction can significantly reduce the footprint and power required.

A programmable waveform generator is provided, comprising: a controllable waveform generator configured to generate an initial bandwidth signal having an initial frequency bandwidth; a tone generator configured to generate a plurality of tone signals, each tone signal having a different frequency; a first bandwidth-multiplying circuit, including a first mixer having a first input port configured to receive the low-bandwidth signal; a first switch configured to choose one of the plurality of tone signals or a phase shifted version of one of the plurality of tone signals and output the chosen signal as a first chosen tone; a controller configured to control the operation of the bandwidth multiplying block, wherein the first mixer is further configured to receive the first chosen tone at a second input port, and wherein the first mixer is further configured to mix the initial bandwidth signal and the first chosen tone to generate a first bandwidth signal at an output port, the first bandwidth signal having a first frequency bandwidth.

The first frequency bandwidth may be greater than the initial frequency bandwidth, and the first frequency bandwidth may be an integer multiple of the initial frequency bandwidth.

The controllable low-bandwidth generator may be a DDS.

The tone generator may comprise a plurality of individual tone generators, each of the plurality of individual tone generators generating one of the plurality of tone signals.

The first switch may choose between a first and second tone signal selected from the plurality of tone signals, and a second frequency of the second tone signal may be determined by the following equation: $F(T_{1,2})=F(T_{1,1})+2L_I+2B_I$, where $F(T_{1,1})$ is the frequency of the first tone signal, $F(T_{1,2})$ is the frequency of the second tone signal, $L_I$ is a low frequency for the initial frequency bandwidth, and $B_I$ is a width of the initial frequency bandwidth. Alternately, the first switch may choose between three or more of the plurality of tone signals.

The programmable waveform generator may further comprise: a first controllable phase shifter connected between a selected one of the plurality of tone generators and the first switch, the first controllable phase shifter configured to generate a first phase-shifted tone signal from a first selected tone signal generated by the selected one of the plurality of tone generators; wherein the first switch chooses between one of the plurality of tone signals and the first phase-shifted tone signal.

The first frequency-multiplying circuit may further include a first filter configured to filter the first multiplied signal. In addition the first filter may comprise a selectable plurality of filters.

The first frequency bandwidth may be twice the initial frequency bandwidth.

The programmable waveform generator may further comprise: a second bandwidth-multiplying circuit, including a second mixer having a third input port configured to receive the first multiplied signal; a second switch configured to choose one of the plurality of tone signals or a phase shifted version of one of the plurality of tone signals and output the chosen signal as a second chosen tone, wherein the second mixer is further configured to receive the second chosen tone at a third input port, wherein the second mixer is further configured to mix the first multiplied signal and the second chosen tone to generate a second bandwidth signal at an output port, the second bandwidth signal having a second frequency bandwidth, wherein the second frequency bandwidth is greater than the first frequency bandwidth, and wherein the second frequency bandwidth is an integer multiple of the first frequency bandwidth.

The programmable waveform generator may further comprise: N bandwidth-multiplying circuits, each of the M bandwidth-multiplying circuits including an $i^{th}$ mixer having an $(2i-1)^{th}$ input port configured to receive the $(i-1)^{th}$ multiplied signal; an $i^{th}$ switch configured to choose one of the plurality of tone signals or a phase shifted version of one of the plurality of tone signals and output the chosen signal as an $i^{th}$ chosen tone, wherein the $i^{th}$ mixer is further configured to receive the $i^{th}$ chosen tone at a $2I^{th}$ input port, wherein the $i^{th}$ mixer is further configured to mix the $(i-1)^{th}$ multiplied signal and the $i^{th}$ chosen tone to generate an $i^{th}$ bandwidth signal at an output port, the $i^{th}$ bandwidth signal having an $i^{th}$ frequency bandwidth, wherein the $i^{th}$ frequency bandwidth is greater than the $(i-1)^{th}$ frequency bandwidth, wherein the $i^{th}$ frequency bandwidth is an integer multiple of the $(i-1)^{th}$ frequency bandwidth, and wherein N is an integer greater than 1, and i is an index value that varies from 2 to N.

A method of generating a waveform is provided, comprising: setting an index value I equal to 0; generating an initial bandwidth signal $G_0$; performing an $(I+1)^{th}$ multiplier operation, including receiving an input bandwidth signal $G_I$, the input bandwidth signal $G_I$ having a bandwidth $B_I$, a low frequency $L_I$, and a high frequency $(L_I+B_I)$; receiving first and second tone signals $T_{I,1}$ and $T_{I,2}$; determining whether a current control state is a first control state or a second control state; selecting the first tone signal $T_{I,1}$ as a chosen signal if the current control state is determined to be the first control state; generating an output bandwidth signal $G_{I+1}$ such that an output frequency of the output bandwidth signal $G_{I+1}$ is equal to a sum of an input frequency of the input bandwidth signal $G_I$ and a first tone frequency of the first tone signal $T_{I,1}$, if the current control state is determined to be the first control state; selecting the second tone signal $T_{I,2}$ as the chosen signal if the current control state is determined to be the second control state; and generating the output bandwidth signal $G_{I+1}$ such that the output frequency of the output bandwidth signal $G_{I+1}$ is equal to a difference between a second tone frequency of the second tone signal $T_{I,2}$ and the input frequency of the input bandwidth signal $G_I$, if the current control state is determined to be the first control state; determining if additional multiplier operations are required; incrementing I by 1 and repeating the performing of the $(I+1)^{th}$ multiplier operation and the determining if additional multiplier operations are required if additional multiplier operations are required; and setting the output bandwidth signal $G_{I+1}$ as an operational output if no additional multiplier operations are required.

BRIEF DESCRIPTION OF THE DRAWINGS

The accompanying figures where like reference numerals refer to identical or functionally similar elements and which together with the detailed description below are incorporated in and form part of the specification, serve to further illustrate an exemplary embodiment and to explain various principles and advantages in accordance with the present invention.

FIG. 12 is a table illustrating a binary tree of states, where each state defines the set of tone signals to be used for all of the bandwidth multiplying circuits, according to a disclosed embodiment;

DETAILED DESCRIPTION

The instant disclosure is provided to further explain in an enabling fashion the best modes of performing one or more embodiments of the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms such as first and second, and the like, if any, are used solely to distinguish one from another entity, item, or action without necessarily requiring or implying any actual such relationship or order between such entities, items or actions. It is noted that some embodiments may include a plurality of processes or steps, which can be performed in any order, unless expressly and necessarily limited to a particular order; i.e., processes or steps that are not so limited may be performed in any order.

Much of the inventive functionality and many of the inventive principles, when implemented, may be supported with or in integrated circuits (ICs), such as dynamic random access memory (DRAM) devices, static random access memory (SRAM) devices, or the like. In particular, they may be implemented using CMOS or bipolar or field effect transistors. It is expected that one of ordinary skill, notwithstanding possibly significant effort and many design choices motivated by, for example, available time, current technology, and economic considerations, when guided by the concepts and principles disclosed herein will be readily capable of generating such ICs with minimal experimentation. Therefore, in the interest of brevity and minimization of any risk of obscuring the principles and concepts according to the present invention, further discussion of such ICs will be limited to the essentials with respect to the principles and concepts used by the exemplary embodiments.

Provide description of the invention and disclosed embodiments. Describe figure-by-figure, setting forth a description of each numbered element. Subheadings may be used if helpful (See "Conclusion" heading below).

Programmable Waveform Generator

Figure 1:
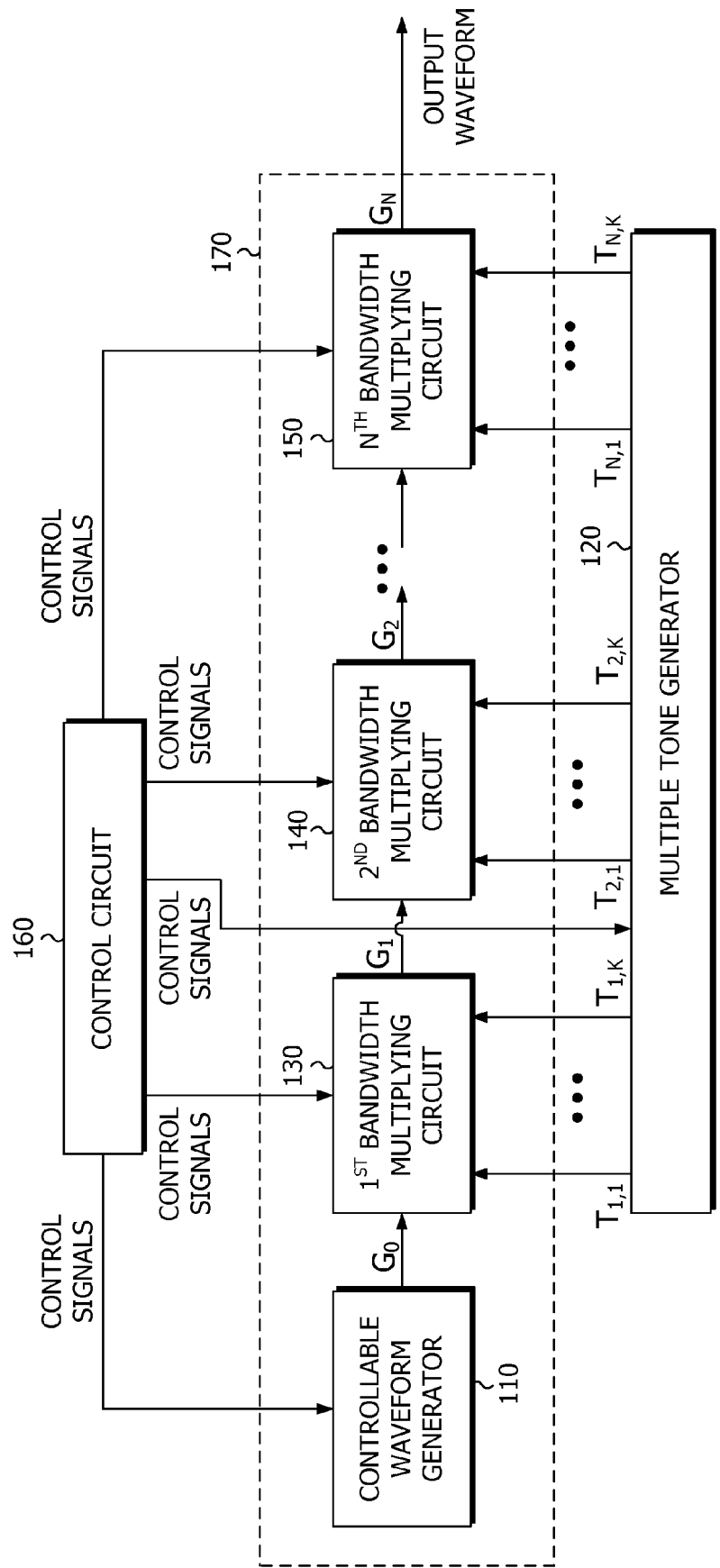
FIG. 1 is a block diagram of a programmable waveform generator according to a disclosed embodiment.

FIG. 1 is a block diagram of a programmable waveform generator 100 according to a disclosed embodiment. As shown in FIG. 1, the programmable waveform generator 100 includes a controllable waveform generator 110, a multiple-tone generator 120, first through $N^{th}$ bandwidth-multiplying circuits 130, 140, 150, and a control circuit 160. The controllable waveform generator 110, and first through $N^{th}$ bandwidth-multiplying circuits 130, 140, 150 can be collectively referred to as a waveform generating circuit 170.

The controllable waveform generator 110 provides an initial bandwidth signal $G_0$ that can contain energy across an initial frequency bandwidth from a low initial bandwidth border to a high initial bandwidth border. In one disclosed embodiment, the initial frequency bandwidth is 1 GHz, ranging from 450 MHz to 1.45 GHz. However, alternate embodiments can use different values for the bandwidth and can have differing bandwidth borders.

In one disclosed embodiment, the controllable waveform generator 110 can be a direct digital synthesizer (DDS). However, in alternate embodiments this could be a waveform playback from random access memory (RAM) through a digital-to-analog converter (DAC), or any circuit that can change frequencies and/or sweep across a frequency bandwidth at a speed sufficient for the desired use.

The multiple-tone generator 120 operates to generate a plurality of tone signals $T_{1,1}, \ldots, T_{N,K}$, each having a different frequency. The tones are selected to simultaneously meet several criteria. One criterion is to choose frequencies to eliminate or mitigate bleed through and higher order harmonics. For example, one would not want a tone used to make $G_1$, to be within the operating bandwidth of $G_1$, because of bleed through across the mixer. Similarly, one would not want to allow any overlap between the input band and the output band. For example $G_1$ should be in a band that allows energy in $G_0$ to be easily filtered out. Also, overlapping harmonic content should be avoided. For example, a $2^{nd}$ or $3^{rd}$ harmonic of $G_0$ should not fall in the band of G1, so they can also be easily filtered out. Overlapping higher order terms should also be avoided. For example the third harmonic of a chosen tone signal, should not mix with any harmonic from the input band, to generate a signal that cannot be easily filtered out of the output band. For example, a harmonic of $T_{1,1}$ when mixed with a harmonic in $G_0$, should not fall into the G1 band. In applications where it is desirable to have continuous frequency sweeps, a pair of tone frequencies must be related to each other by Equation (1).

The first bandwidth-multiplying circuit 130 accepts the initial bandwidth signal $G_0$, having an initial frequency bandwidth, and two or more of the tone signals from the multiple-tone generator 120 and generates a first bandwidth signal $G_1$ that has a first bandwidth that is greater than the initial frequency bandwidth. For example, in one disclosed embodiment, the first bandwidth-multiplying circuit 130 accepts two of the tone signals related by Equation (1) and generates a first bandwidth signal $G_1$ that has a first bandwidth that is exactly twice the initial frequency bandwidth of signal $G_0$.

The second bandwidth-multiplying circuit 140 accepts the first bandwidth signal $G_1$, having a first frequency bandwidth, and two or more of the tone signals from the multiple-tone generator 120 and generates a second bandwidth signal $G_2$ that has a second bandwidth that is greater than the first frequency bandwidth. For example, in one disclosed embodiment, the second bandwidth-multiplying circuit 130 accepts two of the tone signals related by Equation (1) and generates a second bandwidth signal $G_2$ that has a second bandwidth that is exactly twice the first bandwidth of signal $G_1$. In this embodiment, the second frequency bandwidth is four times the initial frequency bandwidth.

The $N^{th}$ bandwidth-multiplying circuit 150 accepts an $(N-1)^{th}$ bandwidth signal and two or more of the tone signals from the multiple-tone generator 120 and generates an $N^{th}$ bandwidth signal that has an $N^{th}$ bandwidth that is greater than the $(N-1)^{th}$ frequency bandwidth. For example, in one disclosed embodiment (where N=3), the $N^{th}$ bandwidth-multiplying circuit 150 accepts two of the tone signals and generates a third bandwidth signal that has a third bandwidth that is twice the second frequency bandwidth of the second bandwidth signal. In this embodiment, the third frequency bandwidth is eight times the initial frequency bandwidth. In the case where each of the bandwidth multiplying circuits uses two tones related by Equation (1), the bandwidth of the final output signal $G_N$ is $2^N$ times the initial bandwidth signal $G_0$.

In various embodiments, the number of bandwidth-multiplying circuits 130, 140, 150 can vary. Although three bandwidth-multiplying circuits 130, 140, 150 are shown in FIG. 1, there can be more or fewer in alternate embodiments, depending upon the needs of the device using the programmable waveform generator 100. In its simplest form, the programmable waveform generator 100 can include a single bandwidth-multiplying circuit 130. Alternate forms can include two, three, or more than three, as needed.

The control circuit 160 provides control signals to control the operation of the controllable waveform generator 110 and the first through $N^{th}$ bandwidth multiplication circuits 130, 140, 150.

Figure 13:
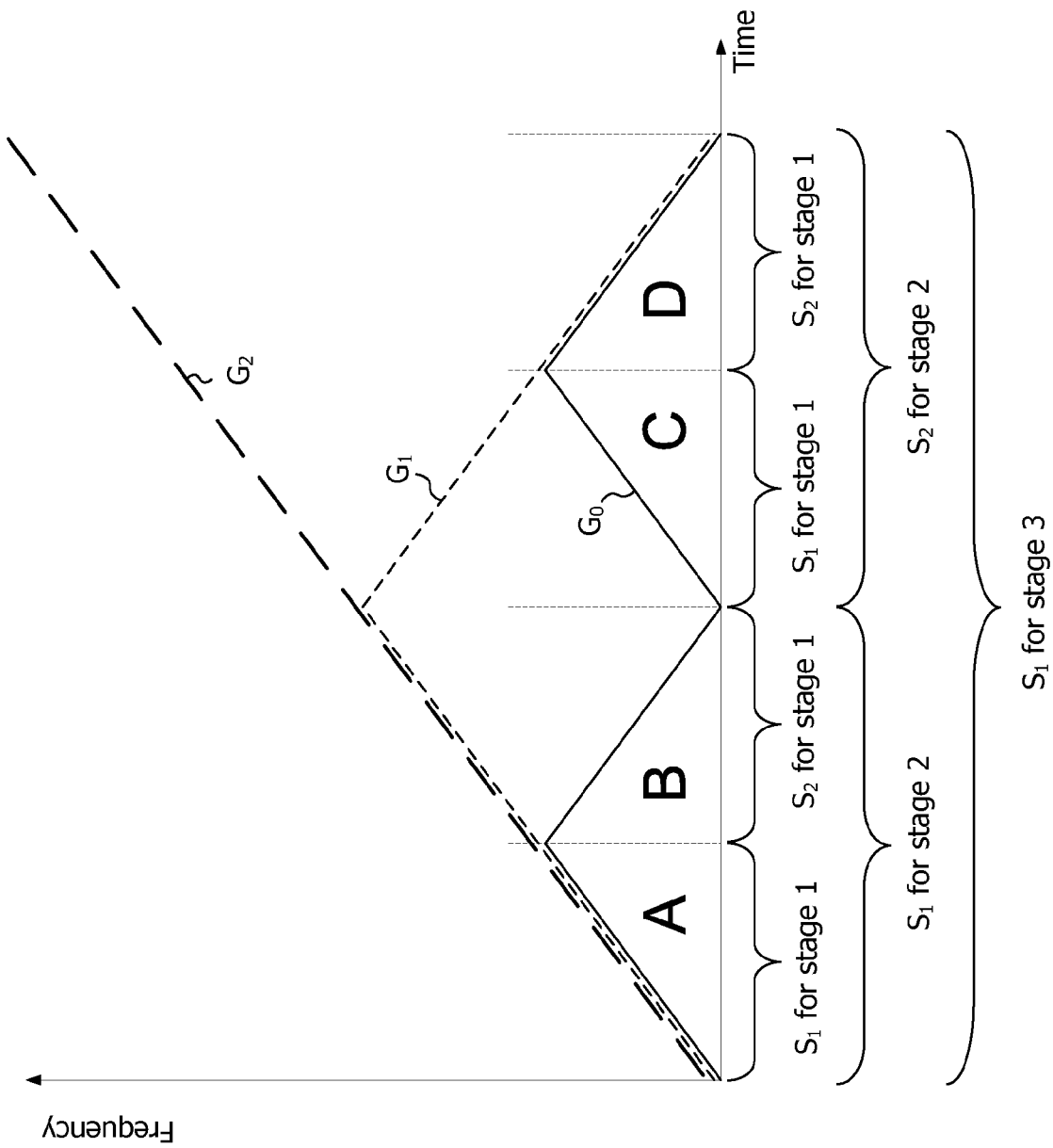
FIG. 13 is a graph showing the mapping between the controllable waveform generator and control state, and the $1^{st}$ bandwidth multiplying circuit, and the $2^{nd}$ bandwidth multiplying circuit for two-tone bandwidth multiplying circuits, according to a disclosed embodiment.

In one disclosed embodiment in which N is 3 and K is 2, the initial signal band is 150 MHz to 400 MHz, and the tone generator provides eight tone signals, $T_{1,1}, \ldots, T_{4,2}$, with the frequencies set forth in Table 1, which also shows the progression of wider and wider frequency bands at each stage, illustrated graphically in FIG. 13. In this embodiment, each bandwidth multiplying circuit 130, 140, 150 receives two of the tone signals. With only 8 tones, the bandwidth has been extended However, alternate embodiments with different values of N and K can generate more or fewer tone signals. And these signals can be at different frequencies, as required by the needs of the application that the programmable waveform generator 100 is used with. In this alternate case, while the output band may not be contiguous, the bandwidth growth is still exponential as each stage expands upon expansion made in the previous stage.

TABLE 1

Exemplary Tone Signals and Frequencies

| Tone Signal | Frequency | Input Range | Output Range |
|---|---|---|---|
| $T_{1,1}$ | 1.35 GHz | $G_0 = .15$-$.4$ | $G_1 = 1.5$-$1.75$ |
| $T_{1,2}$ | 2.15 GHz | $G_0 = .4$-$.15$ | $G_1 = 1.75$-$2$ |
| $T_{2,1}$ | 5.5 GHz | $G_1 = 1.5$-$2$ | $G_2 = 7$-$7.5$ |
| $T_{2,2}$ | 10 GHz | $G_1 = 2$-$1.5$ | $G_2 = 7.5$-$8$ |
| $T_{3,1}$ | 2 GHz | $G_2 = 7$-$8$ | $G_3 = 9$-$10$ |
| $T_{3,2}$ | 18 GHz | $G_2 = 8$-$7$ | $G_3 = 10$-$11$ |
| $T_{4,1}$ | 4 GHz | $G_2 = 9$-$11$ | $G_3 = 13$-$15$ |
| $T_{4,2}$ | 26 GHz | $G_2 = 11$-$9$ | $G_3 = 15$-$17$ |

In this disclosed embodiment, each bandwidth multiplying circuit 130, 140, 150 receives the same number of tone signals (i.e., two). In alternate embodiments, however, this need not be the case. Different bandwidth multiplying circuits 130, 140, 150 can receive different numbers of tone signals.

The Bandwidth Multiplying Circuit

FIGS. 2 to 7 show various embodiments of the bandwidth multiplying circuits 130, 140, 150 of FIG. 1, according to disclosed embodiments. Similar elements within these embodiments operate in a similar manner. Therefore, the operation of every element will not be separately described for each embodiment. Also, for the sake of simplicity of disclosure, an embodiment of the first bandwidth multiplying circuit 130 will be shown. It should be understood, however, that this embodiment applies equally to the other bandwidth multiplying circuits 140, 150 as well.

Figure 2:
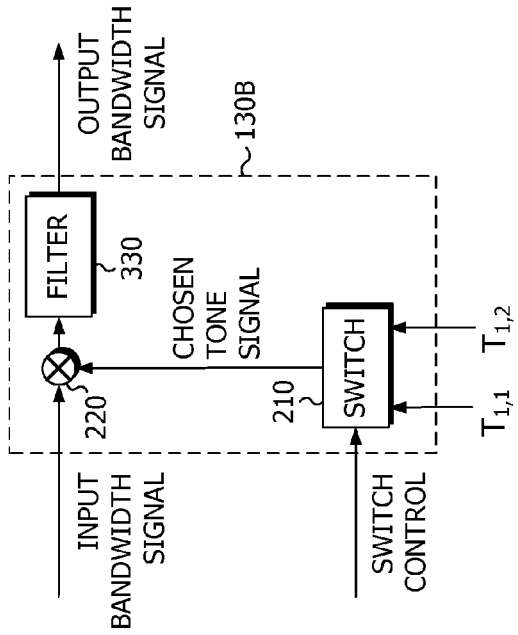
FIG. 2 is a block diagram of a bandwidth multiplying circuit of FIG. 1, according to a first disclosed embodiment.

FIG. 2 is a block diagram of a bandwidth multiplying circuit 130A of FIG. 1, according to a first disclosed embodiment. As shown in FIG. 2, the bandwidth multiplying circuit 130A includes a switch 210 and a multiplier 220.

The switch 210 receives two tone signals $T_{1,1}$ and $T_{1,2}$, and selects one of these two tone signals as a chosen tone signal based on a switch control signal. The switch control signal indicates a control state of the bandwidth multiplying circuit 130A, as described below.

The multiplier 220 mixes the chosen tone signal ($T_{1,1}$ or $T_{1,2}$) and an input bandwidth signal to generate an output bandwidth signal. This mixing operation is performed such that the frequency of the output bandwidth signal is a function of the frequency of the chosen tone signal ($T_{1,1}$ or $T_{1,2}$) and the frequency of the input bandwidth signal. The combined bandwidth of the output band created by $T_{1,1}$ and the output band created by $T_{1,2}$ is wider than the input bandwidth.

In the disclosed embodiment in which two tone signals $T_{1,1}$ and $T_{1,2}$ are used, and contiguous operation is desired, the relationship between the frequency of the output bandwidth signal, the frequency of the chosen tone signal ($T_{1,1}$ or $T_{1,2}$), and the frequency of the input bandwidth signal is determined by Equations (1) through (4), depending upon whether the first tone signal $T_{1,1}$ or the second tone signal $T_{1,2}$ is the chosen tone signal.

To force the transition point to be transient free, the frequencies of the tone signals $T_{I,1}$ and $T_{I}2$ are related according to equation (1), $$F(T_{I,2}) = F(T_{I,1}) + 2L_I + 2B_I, \quad (1)$$

Where $F(T_{1,2})$ is the frequency of the second tone signal $T_{1,2}$, $F(T_{1,1})$ is the frequency of the first tone signal $T_{1,1}$. $L_I$ is the lowest frequency that the input bandwidth signal takes on the $I^{th}$ stage, and $B_I$ is the bandwidth of the input signal at the $I^{th}$ stage.

It should be noted that in these equations, $T_{I,1}$ can be considered to have a negative frequency, i.e., $$-\infty < F(T_{I,x}) < \infty. \quad (2)$$

If the first tone signal $T_{1,1}$ is the chosen tone signal, then the frequency of the output bandwidth is determined according to equation (3), $$F(O) = F(T_{I,1}) + F(I), \quad (3)$$

where F(O) is the frequency of the output bandwidth signal, F(I) is the frequency of the input bandwidth signal.

If, however, the second tone signal $T_{1,2}$ is the chosen tone signal, then the frequency of the output bandwidth signal is determined according to equation (4), $$F(O) = F(T_{I,2}) - F(I). \quad (4)$$

The addition versus subtraction difference between equations (3) and (4) captures the effect of high-side versus low side mixing, or using an upper sideband versus a lower sideband.

The RF switches that choose the tone signals, such as switch 210, can operate at extremely fast speeds—a few billionths of a second. As a result, the output frequency can be hopped across the entire extended frequency range at speeds that are essentially equal to the core switching speed of the controllable waveform generator.

Figure 3:
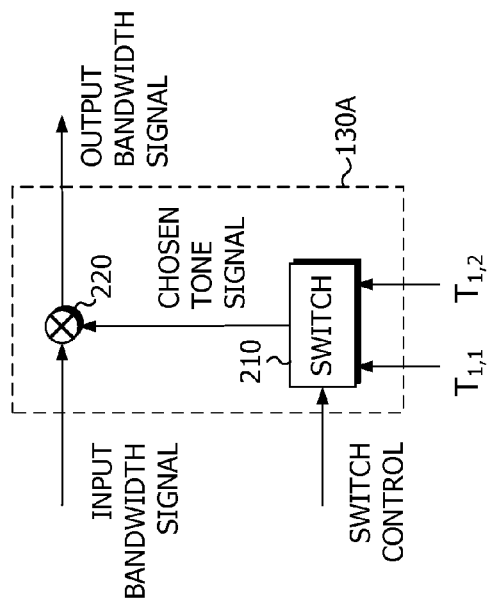
FIG. 3 is a block diagram of a bandwidth multiplying circuit of FIG. 1, according to a second disclosed embodiment.

FIG. 3 is a block diagram of a bandwidth multiplying circuit 130B of FIG. 1, according to a second disclosed embodiment. As shown in FIG. 3, the bandwidth multiplying circuit 130B is similar to the bandwidth multiplying circuit 130A of FIG. 2, except that the output of the mixer 220 is passed through a filter 330 before it is provided as the output bandwidth signal. The filter is designed to pass the desired frequency band and reject energy outside of this band, such as harmonic and bleed through signals.

Figure 4:
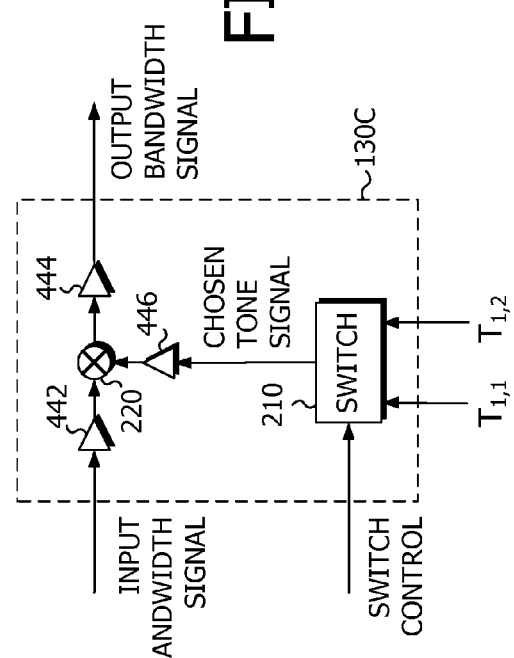
FIG. 4 is a block diagram of a bandwidth multiplying circuit of FIG. 1, according to a third disclosed embodiment.

FIG. 4 is a block diagram of a bandwidth multiplying circuit 130C of FIG. 1, according to a third disclosed embodiment. As shown in FIG. 4, the bandwidth multiplying circuit 130C is similar to the bandwidth multiplying circuit 130A of FIG. 2, except that amplifiers are included. The amplifiers are chosen to reduce reflection coefficients into and out of the mixer, and to make up for losses.

Figure 5:
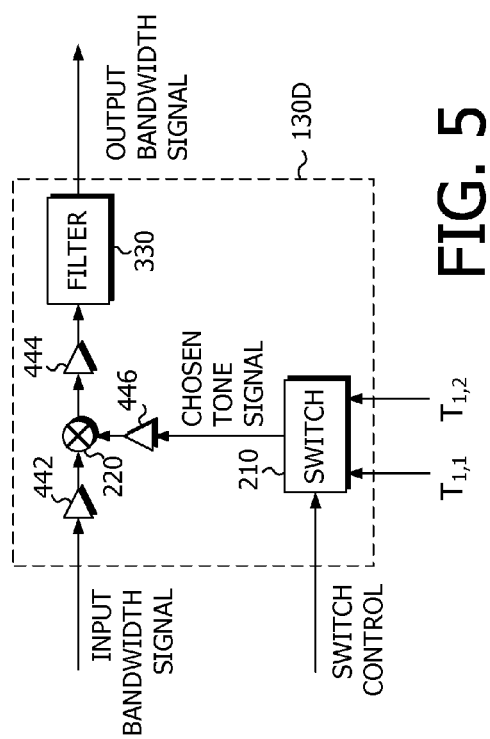
FIG. 5 is a block diagram of a bandwidth multiplying circuit of FIG. 1, according to a fourth disclosed embodiment.

FIG. 5 is a block diagram of a bandwidth multiplying circuit 130D of FIG. 1, according to a fourth disclosed embodiment. As shown in FIG. 5, the bandwidth multiplying circuit 130D is similar to the bandwidth multiplying circuits 130B and 130C of FIGS. 3 and 4, except that uses both the amplifiers and the filter.

Figure 6:
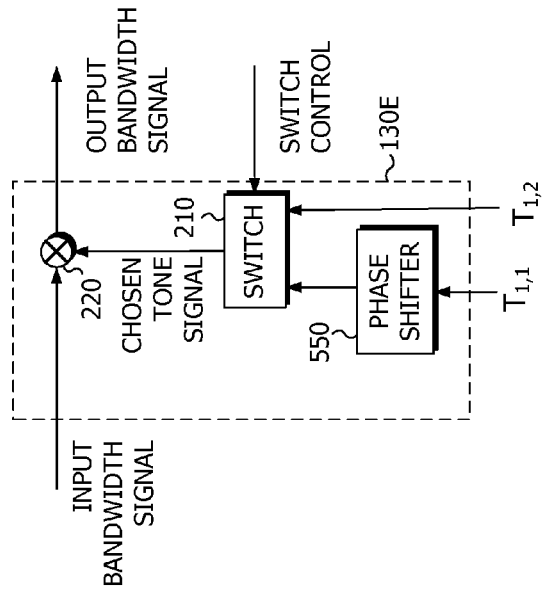
FIG. 6 is a block diagram of a bandwidth multiplying circuit of FIG. 1, according to a fifth disclosed embodiment.

FIG. 6 is a block diagram of a bandwidth multiplying circuit 130E of FIG. 1, according to a fifth disclosed embodiment. As shown in FIG. 6, the bandwidth multiplying circuit 130E is similar to the bandwidth multiplying circuit 130A of FIG. 2, except that includes a phase shifter to allow the phase relationship between the inputs to be adjusted. This phase shifter can be implemented by all standard methods, such as trimming transmission line lengths, or by a voltage controlled phase shift network, or could functionally be covered by adjusting the phase of the phase locked oscillator producing the tone signal, relative to its reference.

While the phase shifters as shown in FIG. 6 do not affect the frequency, they are useful to allow adjustment of the phase between the tone signals so that the phase of the output signal is not changed at the point where a state change happens. For example, at the transition from state 1 to state 2, where the controllable waveform generator is at its highest frequency, and where only the $1^{st}$ bandwidth multiplying circuit is changing its chosen tone signal, phase shifter 1,1 could be adjusted so that the output signals phase does not change at the switchover point. Similarly, the phase shifters in each bandwidth multiplying circuit can be adjusted such that the phase is consistent across all state transitions. Alternatively, the phase of the controllable waveform generator could be programmed to offset any phase difference between the state changes. This approach has the advantage of eliminating the phase shifters, but has the disadvantage of potentially causing ringing in a filter within the controllable waveform generator. Another alternative is to use a tone generator capable of shifting the relative phases of the signals, such as that shown in FIG. 9.

Figure 7:
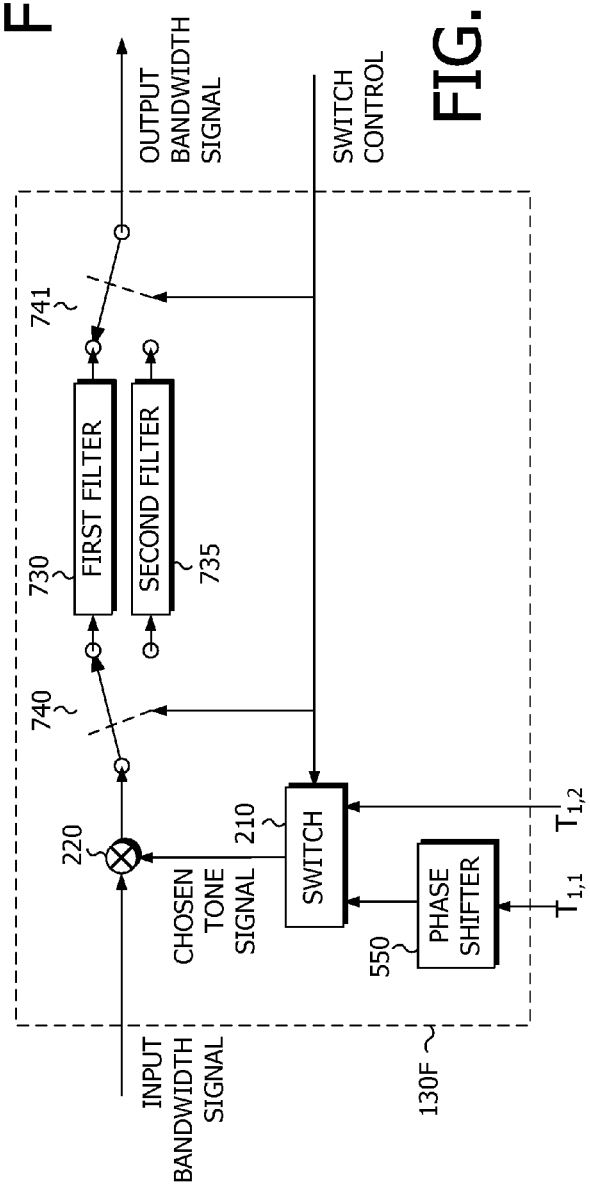
FIG. 7 is a block diagram of a bandwidth multiplying circuit of FIG. 1, according to a sixth disclosed embodiment.

FIG. 7 is a block diagram of a bandwidth multiplying circuit 130F of FIG. 1, according to a sixth disclosed embodiment. As shown in FIG. 7, the bandwidth multiplying circuit 130F is similar to the bandwidth multiplying circuits 130D and 130E of FIGS. 5 and 6, except that it uses both the phase shifter, and multiple filters. Occasionally, one or both of these cases occur:

TABLE 2

Generation of Harmonics and Spurious Signals

| Case | Description |
|---|---|
| 1 | harmonics and spurious signals generated when $T_{1,1}$ is selected fall in the output band produced with $T_{2,1}$ is selected |
| 2 | harmonics and spurious signals generated when $T_{2,1}$ is selected fall in the output band produced with $T_{1,1}$ is selected |

By using separate filters for each tone signal, a higher purity signal can be produced because the filters are nearly half the bandwidth of a filter that covers the entire output frequency band, and they can eliminate the harmonics associated with Case 1 and Case 2.

Switch 740 and 741 could be implemented as a single double-pole double-throw (DPDT) switch, or a pair of single-pole double-throw (SPDT) switches. Switch 740 could also be replaced with a splitter such that both filters 730 and 735 received the signal regardless of switch position. Using the splitter has the disadvantage of more loss and the advantage of lower transients.

Figure 8:
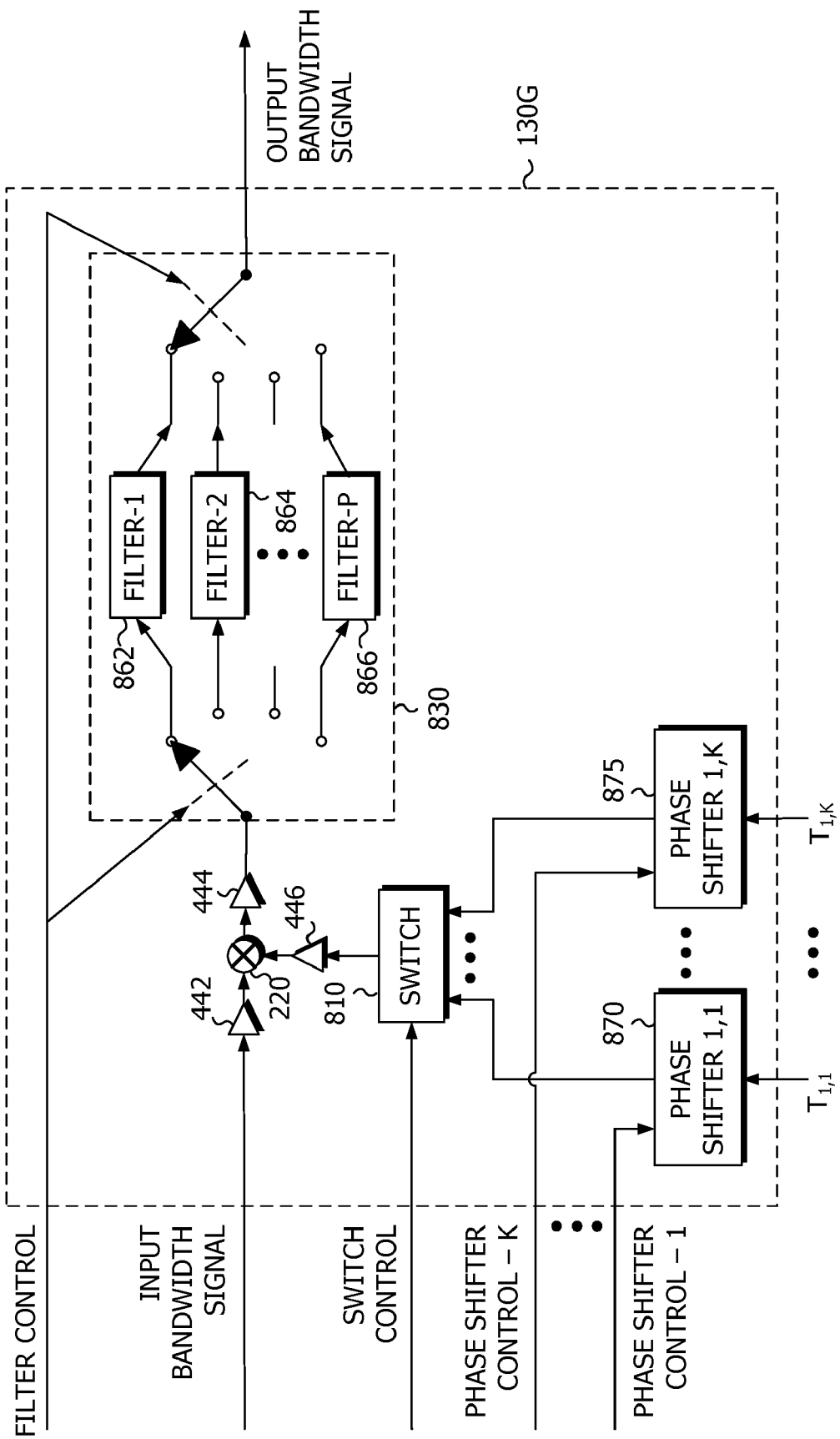
FIG. 8 is a block diagram of a bandwidth multiplying circuit of FIG. 1, according to a sixth disclosed embodiment.

FIG. 8 is a block diagram of a bandwidth multiplying circuit 130G of FIG. 1, according to a seventh disclosed embodiment. As shown in FIG. 8, the bandwidth multiplying circuit 130G is similar to the bandwidth multiplying circuit 130F of FIG. 7, with two changes. The embodiment of FIG. 8 uses a plurality of tone signals $T_{1,1}, \ldots, T_{1,K}$, passing through a plurality of phase shifters 870, . . . , 875, to the inputs of a multiple-input-single-output switch 810. Also, in the embodiment of FIG. 8, a filter circuit 830 includes a plurality of selectable filters 862, 864, 866. A filter control signal is provided to select one of the plurality of selectable filters 862, 864, 866 to filter the output of the mixer 220 before it is provided as an output bandwidth signal. The number of filters P and the number of phase shifters K may be the same or may be different. In some embodiments one or more of the phase shifters 870, . . . , 875 can be eliminated, allowing the associated tone signal to be supplied directly to the switch 210.

In some applications, it is advantageous to add additional bands to the output signal rather than adding another bandwidth multiplying circuit. One advantage can be a reduced part count because the required bandwidth does not need another bandwidth multiplying circuit stage. Another advantage may be that the frequency ranges required to implement another bandwidth multiplying circuit stage requires the use of much more expensive parts.

The Tone Generator

Figure 9:
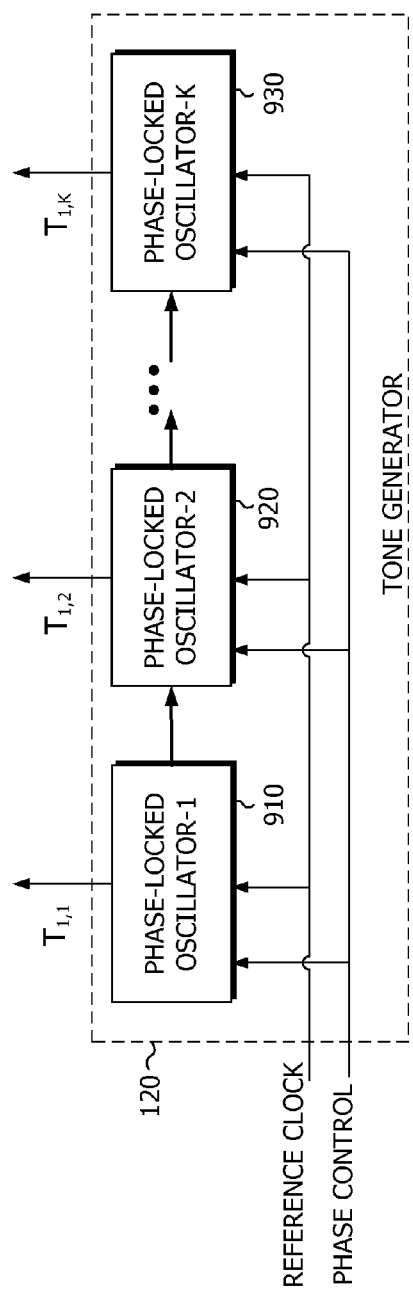
FIG. 9 is a block diagram of the multiple-tone generator of FIG. 1 according to one disclosed embodiment.

FIG. 9 is a block diagram of the multiple-tone generator 120 of FIG. 1 according to one disclosed embodiment. As shown in FIG. 9, there is a bank of oscillators 910, 920, 930, that generate all the required tone signals. All the oscillators are all phase-locked to a common reference. A control signal can be used to adjust the relative phases between the tones. Multiple required frequencies could be derived from a single, or a few, phase-locked-loop (PLL) synthesizers under the control of the controller, as long as the required switching speed was not too demanding.

Figure 10:
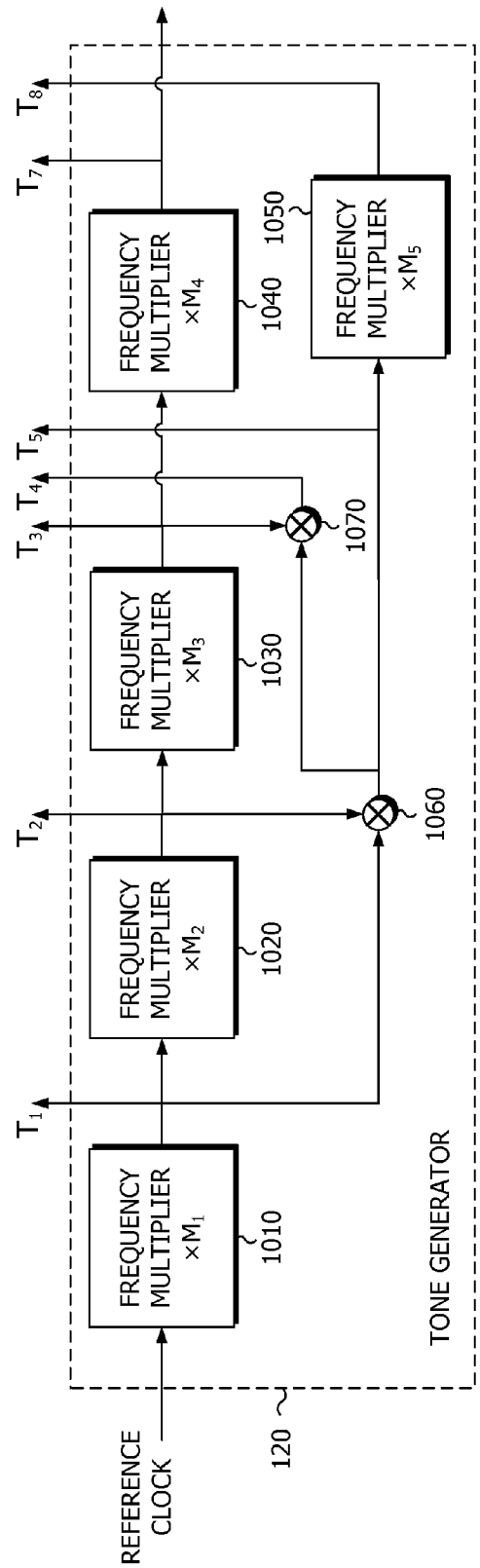
FIG. 10 is a block diagram of the multiple-tone generator of FIG. 1 according to another disclosed embodiment.

FIG. 10 is a block diagram of the multiple-tone generator 120 of FIG. 1 according to a disclosed embodiment. As shown in FIG. 10, all the required tone signals are derived from the common reference by using a network of multipliers (1010, 1020, 1030, 1040, 1050) and mixers (1060, 1070). A network comprised of a mixture of phase locked oscillators, and multipliers and mixers could also be used for the tone generator.

Method of Operation

Figure 11:
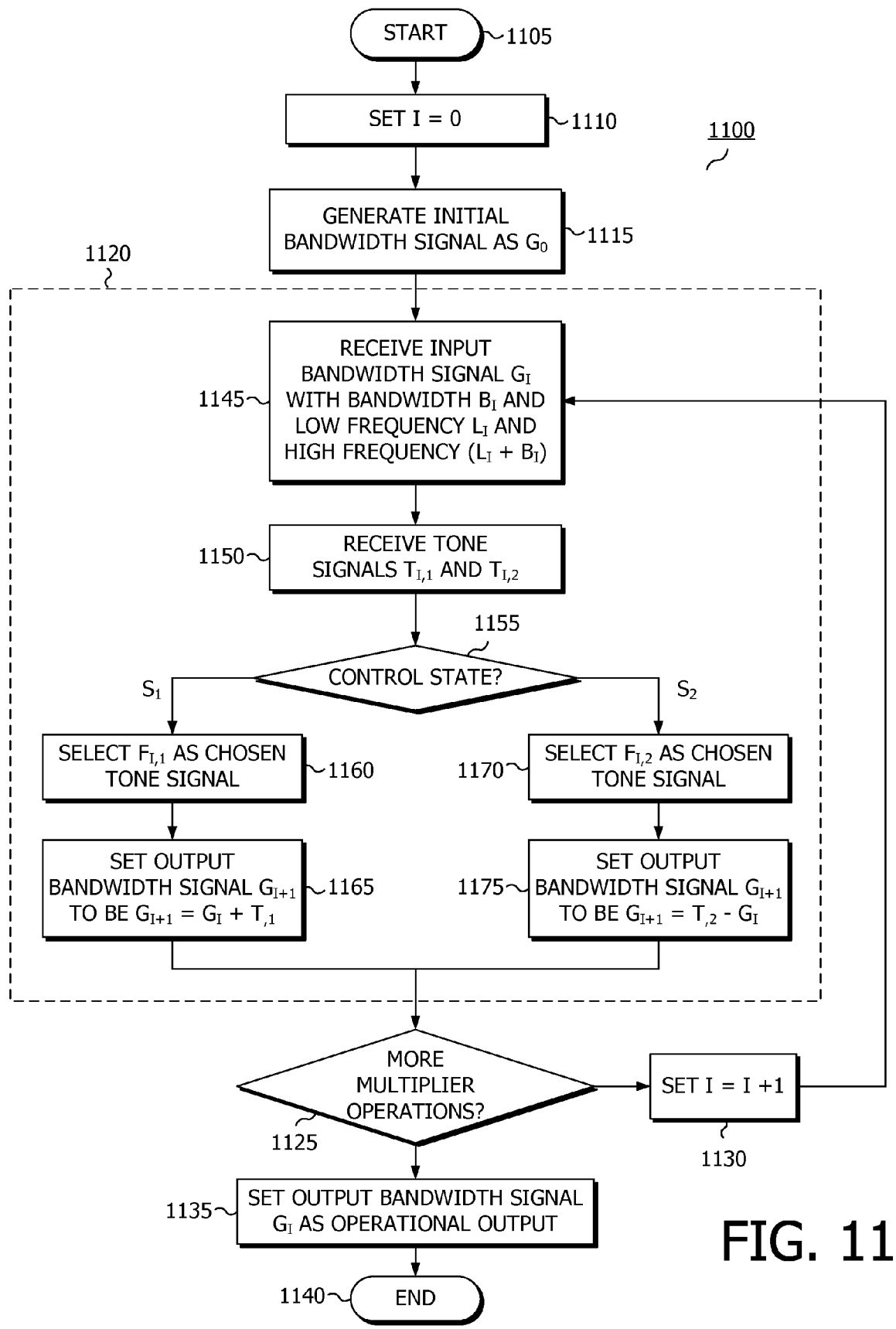
FIG. 11 is a flow chart showing a waveform generation operation 1000 according to a disclosed embodiment.

FIG. 11 is a flow chart showing a waveform generation operation 1100 according to a disclosed embodiment. As shown in FIG. 10, after the operation starts 1105, a value of I is set to 0. (1110) In the waveform generation operation I is an index for the individual bandwidth multiplier circuit operations.

Once I is set to 0, the waveform generation operation generates an initial bandwidth signal, which it sets as $G_0$. (1115) This initial bandwidth signal is thus used as an input bandwidth signal for the first multiplier operation.

The current multiplier operation then performs an $(I+1)^{th}$ multiplier operation. (1120) An $(I+1)^{th}$ multiplier operation receives an input bandwidth signal $G_I$, and generates an output bandwidth signal $G_{(I+1)}$ (e.g., during a first multiplier operation, I=0, the input bandwidth signal is $G_0$ and the output bandwidth signal is $G_1$).

Once the multiplier operation 1120 is completed, the waveform generation operation 1100 determines whether there are anymore multiplier operations to be performed. (1125) If there are, it increments I, i.e., sets I=I+1 (1130), and repeats the multiplier operation 1120.

If, however, there are no more multiplier operations 1120 to be performed (1125), then the waveform generation operation 1100 sets the current output bandwidth signal $G_I$ as the operational output (1135), and ends operation. (1140)

One embodiment of the multiplier operation 1120 will now be described in detail below.

An $(I+1)^{th}$ multiplier operation 1120 begins by receiving an input bandwidth signal $G_I$, which has a bandwidth $B_I$, a low frequency $L_I$, and a high frequency of $(L_I+B_I)$. (1145) The multiplier operation 1120 then receives two tone signals $T_{I,1}$ and $T_{I,2}$, each with a corresponding frequency. (1150)

Then the multiplier operation 1120 determines a current control state (e.g., state $S_1$ or state $S_2$). (1155) This control state indicates which of the two tone signals should be selected.

Based on the value of the controls state, the multiplier operation 1120 then selects a tone signal and sets and output bandwidth signal $G_{I+1}$. If the control state is a first control state $S_1$, then the tone signal $T_{I,1}$ is selected as a chosen tone signal (1160) and the frequency of the output bandwidth signal $G_{I+1}$ is set to be the sum of the frequency of the input bandwidth signal $G_I$ and the frequency of the chosen tone signal $T_{I,1}$ (1165), as shown above by Equation (3), i.e., $$F(G_{I+1})=F(G_I)+F(T_{I,1}) \quad (5)$$

If, however, the control state is a second control state $S_2$, then the tone signal $T_{I,2}$ is selected as a chosen tone signal (1170) and the frequency of the output bandwidth signal $G_{I+1}$ is set to be the difference between the frequency of the chosen tone signal TI,2 and the frequency of the input bandwidth signal GI (1175), as shown above by Equation (4), i.e., $$F(G_{I+1})=F(T_{I,2})-F(G_I) \quad (6)$$

It should be noted that in these equations, $T_{I,1}$ can be considered to have a negative frequency, as shown above in Equation (2), i.e., $$-\infty<F(T_{I,1})<\infty \quad (7)$$

Furthermore, the frequencies of the tone signals $T_{I,1}$ and $T_{I,2}$ are related according to the following equation:

$$F(T_{I,2})=F(T_{I,1})+2L_I+2B_I \quad (8)$$

In the embodiment of the multiplier operation 1120 disclosed above, each multiplier operation 1120 employs two tone signals and two corresponding control states. However, this is by way of example only. Alternate embodiments could employ K tone signals and K corresponding control states, where K is an integer greater than 2. In this case, the number and frequencies of the tone signals, as well as the states regarding when to choose them, are set to achieve a desired bandwidth for the output bandwidth signal. Each extra tone will increase the bandwidth of the output bandwidth signal. So by adding additional tones, the bandwidth of the output bandwidth signal will be increased.

In order to achieve this, however, and keep the output continuous, the states for selecting the tones should be chosen to alternate adding a tone to the input signal and subtracting the input signal from a tone. For example, in the disclosed embodiment using two tones for each switch, a first tone is added to the input signal during a first control state, and the input signal is subtracted from the second tone during a second control state. If three tones and three control states were used, the progression could follow the addition and subtraction of the two-tone example, but add another addition operation after the subtraction operation. More operations could be added, so long as they alternate between addition and subtraction. Furthermore, the addition tones should continually increase in frequency and the subtraction tones should continually increase in frequency, so that the output bandwidth signal will also continually increase in frequency.

In addition, the junction of two bandwidth multipliers should always be different operations. For example, if one bandwidth multiplier ends with an addition operation, then the next bandwidth multiplier should begin with a subtraction operation. Likewise, if a bandwidth multiplier ends with a subtraction operation, the next bandwidth multiplier should begin with an addition operation.

FIG. 12 is a table illustrating a binary tree of states for an embodiment in which two tone signals are used for each switch, where each state defines the set of tone signals to be used for all of the bandwidth multiplying circuits, according to a disclosed embodiment. The table shows a binary progression of values for a system using only three bandwidth multiplying circuits as an example that could be extended to any number of bandwidth multiplying circuits. There is no requirement that the state labeling be in any particular order, only that the states allow the desired frequencies to be generated. The state table shown in FIG. 12 could be applied to the example frequency set given in Table 1 above.

FIG. 13 is a graph showing the mapping between the control state, the controllable waveform generator, the $1^{st}$ bandwidth multiplying circuit, and the $2^{nd}$ bandwidth multiplying circuit for two-tone bandwidth multiplying circuits, according to a disclosed embodiment. For clarity, the plots of FIG. 13 have been shifted to all start at near zero frequency at the left side of the plot. In practice, the waveforms would be offset vertically according to any particular design. For any desired output frequency, the graph shows what state to select and what the frequency needs to be generated by the controllable waveform generator. The RF switches that choose the tone signals can operate at extremely fast speeds (a few billionths of a second). As a result, the output frequency can be hopped across the entire extended frequency range at speeds that are essentially equal to the core switching speed of the controllable waveform generator. This graph also illustrates how the mapping allows the controllable waveform generator to have a smooth change in frequency, with no abrupt discontinuities or steps, and generate a smooth continuous sweep across the entire extended frequency range.

In particular, FIG. 13 shows the initial bandwidth signal $G_0$, and the output bandwidth signals $G_1$ and $G_2$ from the first and second bandwidth multiplying circuits 130 and 140 of FIG. 1. As shown in FIG. 13, the first output bandwidth signal $G_1$ has twice the bandwidth of the initial bandwidth signal $G_0$; and the second output bandwidth signal $G_2$ has twice the bandwidth of the first output bandwidth signal $G_1$, and four times the bandwidth of the initial bandwidth signal $G_0$. This can easily be extended for additional bandwidth multiplying circuits.

Figure 14:
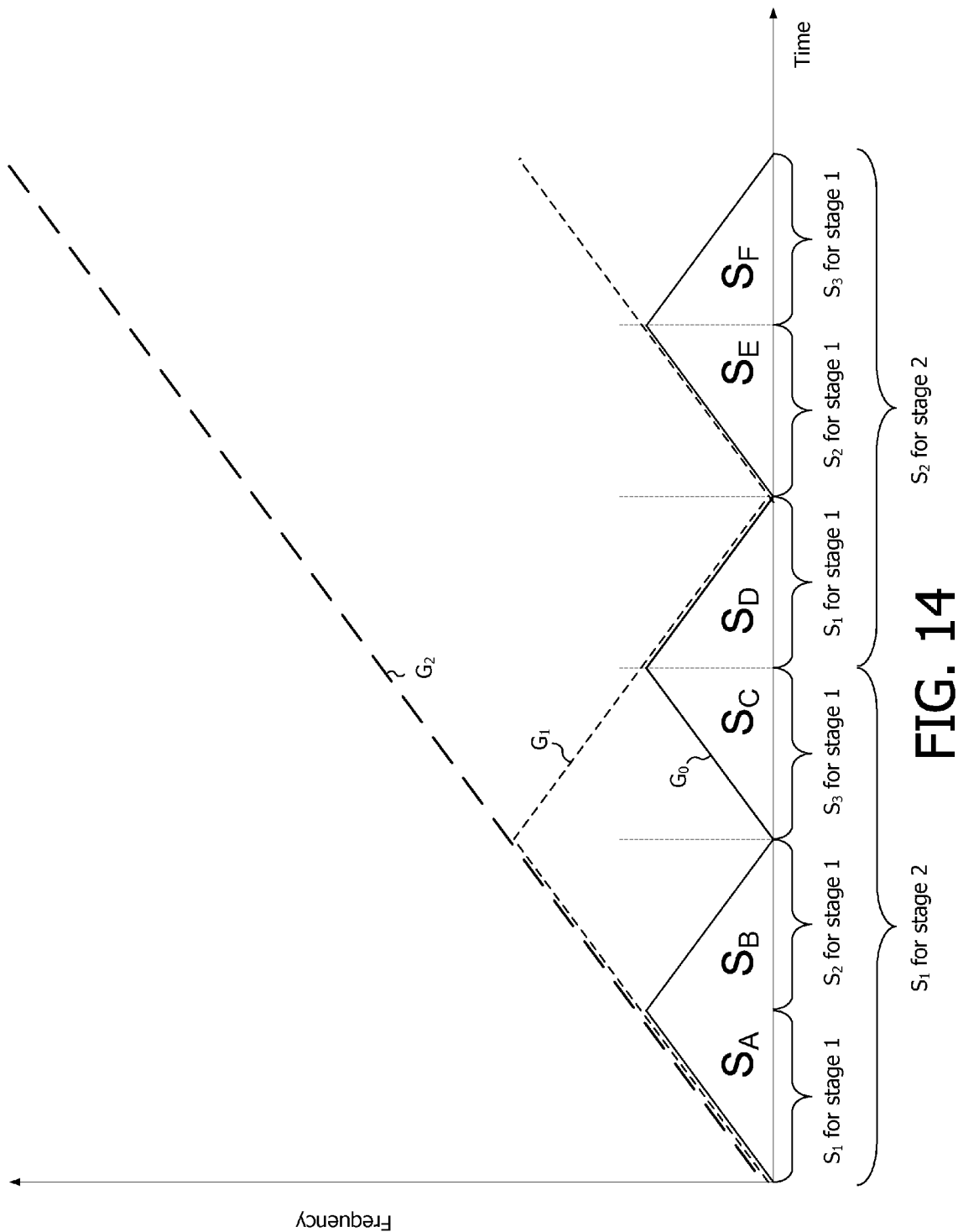
FIG. 14 is a graph showing the mapping between the controllable waveform generator and control state, and the $1^{st}$ bandwidth multiplying circuit, and the $2^{nd}$ bandwidth multiplying circuit for three-tone bandwidth multiplying circuits, according to a disclosed embodiment.

FIG. 14 is a graph showing the mapping between the control state, the controllable waveform generator, the $1^{st}$ bandwidth multiplying circuit, and the $2^{nd}$ bandwidth multiplying circuit for three-tone bandwidth multiplying circuits, according to a disclosed embodiment. For clarity, the plots of FIG. 14 have been shifted to all start at near zero frequency at the left side of the plot. In practice, the waveforms would be offset vertically according to any particular design. For any desired output frequency, the graph shows what state to select and what the frequency needs to be generated by the controllable waveform generator. The RF switches that choose the tone signals can operate at extremely fast speeds (a few billionths of a second). As a result, the output frequency can be hopped across the entire extended frequency range at speeds that are essentially equal to the core switching speed of the controllable waveform generator. This graph also illustrates how the mapping allows the controllable waveform generator to have a smooth change in frequency, with no abrupt discontinuities or steps, and generate a smooth continuous sweep across the entire extended frequency range.

Unlike the embodiment of FIG. 13, this embodiment employs three tones in each bandwidth multiplier. As a result, each bandwidth multiplier has three control states corresponding to three separate operations. Furthermore, since there are an odd number of states in the first and second bandwidth multipliers, they will be configured opposite to each other with respect to addition and subtraction operations. The states $S_A$, $S_B$, and $S_C$ for the first bandwidth multiplier (i.e., the first stage), will correspond to an addition, a subtraction, and an addition operation, respectively. In contrast, the states $S_D$, $S_E$, and $S_F$ for the second bandwidth multiplier (i.e., the second stage), will correspond to a subtraction, an addition, and a subtraction operation, respectively. This will allow for a continuous transition between the first bandwidth multiplier and the second bandwidth multiplier (i.e., between the first and the second stage).

Although the embodiments of FIGS. 13 and 14 both show implementations in which the first and second bandwidth multipliers have the same number of tone inputs, this is by way of example only. The number of tone inputs could be different for some bandwidth multipliers, the same for others, or any suitable combination.

CONCLUSION

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled. The various circuits described above can be implemented in discrete circuits or integrated circuits, as desired by implementation.

What is claimed is:

1. A programmable waveform generator, comprising:
   a controllable waveform generator configured to generate an initial bandwidth signal having an initial frequency bandwidth;
   a tone generator configured to generate a plurality of tone signals, each tone signal having a different frequency;
   a first bandwidth-multiplying circuit, including
      a first mixer having a first input port configured to receive the initial bandwidth signal;
      a first switch configured to choose one of the plurality of tone signals or a phase shifted version of one of the plurality of tone signals and output the chosen signal as a first chosen tone;
   a controller configured to control the operation of the first bandwidth-multiplying circuit,
   wherein the first mixer is further configured to receive the first chosen tone at a second input port, and
   wherein the first mixer is further configured to mix the initial bandwidth signal and the first chosen tone to generate a first bandwidth signal at an output port, the first bandwidth signal having a first frequency bandwidth.

2. The programmable waveform generator of claim 1, wherein
   wherein the first frequency bandwidth is greater than the initial frequency bandwidth, and
   wherein the first frequency bandwidth is an integer multiple of the initial frequency bandwidth.

3. The programmable waveform generator of claim 1, wherein
   the controllable waveform generator is a DDS.

4. The programmable waveform generator of claim 1, wherein
   the tone generator comprises a plurality of individual tone generators, each of the plurality of individual tone generators generating one of the plurality of tone signals.

5. The programmable waveform generator of claim 1, wherein
   the first switch chooses between a first and second tone signal selected from the plurality of tone signals, and a second frequency of the second tone signal is determined by the following equation:

$$F(T_{1,2})=F(T_{1,1})+2L_I+2B_I,$$

where $F(T_{1,1})$ is the frequency of the first tone signal, $F(T_{1,2})$ is the frequency of the second tone signal, $L_I$ is a low frequency for the initial frequency bandwidth, and $B_I$ is a width of the initial frequency bandwidth.

6. The programmable waveform generator of claim 1, wherein the first switch chooses between three or more of the plurality of tone signals.

7. The programmable waveform generator of claim 1, further comprising:
a first controllable phase shifter connected between the tone generator and the first switch, the first controllable phase shifter configured to generate a first phase-shifted tone signal from a first selected tone signal generated by the tone generator;
wherein the first switch chooses between one of the plurality of tone signals and the first phase-shifted tone signal.

8. The programmable waveform generator of claim 1, wherein
the first bandwidth-multiplying circuit further includes a first filter configured to filter the first bandwidth signal.

9. The programmable waveform generator of claim 8, wherein
the first filter comprises a selectable plurality of filters.

10. The programmable waveform generator of claim 1, wherein
the first frequency bandwidth is twice the initial frequency bandwidth.

11. The programmable waveform generator of claim 1, further comprising:
a second bandwidth-multiplying circuit, including
a second mixer having a third input port configured to receive the first bandwidth signal;
a second switch configured to choose one of the plurality of tone signals or a phase shifted version of one of the plurality of tone signals and output the chosen signal as a second chosen tone,
wherein the second mixer is further configured to receive the second chosen tone at a third input port,
wherein the second mixer is further configured to mix the first bandwidth signal and the second chosen tone to generate a second bandwidth signal at an output port, the second bandwidth signal having a second frequency bandwidth,
wherein the second frequency bandwidth is greater than the first frequency bandwidth, and
wherein the second frequency bandwidth is an integer multiple of the first frequency bandwidth.

12. The programmable waveform generator of claim 1, further comprising:
N bandwidth-multiplying circuits, each of the N bandwidth-multiplying circuits including
an $i^{th}$ mixer having an $(2i-1)^{th}$ input port configured to receive an $(i-1)^{th}$ multiplied signal;
an $i^{th}$ switch configured to choose one of the plurality of tone signals or a phase shifted version of one of the plurality of tone signals and output the chosen signal as an $i^{th}$ chosen tone,
wherein the $i^{th}$ mixer is further configured to receive the $i^{th}$ chosen tone at a $2I^{th}$ input port,
wherein the $i^{th}$ mixer is further configured to mix the $(i-1)^{th}$ multiplied signal and the $i^{th}$ chosen tone to generate an $i^{th}$ bandwidth signal at an output port, the $i^{th}$ bandwidth signal having an $i^{th}$ frequency bandwidth,
wherein the $i^{th}$ frequency bandwidth is greater than the $(i-1)^{th}$ frequency bandwidth,
wherein the $i^{th}$ frequency bandwidth is an integer multiple of the $(i-1)^{th}$ frequency bandwidth, and
wherein N is an integer greater than 1, and i is an index value that varies from 2 to N.

13. A method of generating a waveform, comprising:
setting an index value I equal to 0;
generating an initial bandwidth signal $G_o$;
performing an $(I+1)^{th}$ multiplier operation, including
receiving an input bandwidth signal $G_I$, the input bandwidth signal $G_I$ having a bandwidth $B_I$, a low frequency $L_I$, and a high frequency $(L_I+B_I)$;
receiving first and second tone signals $T_{I,1}$ and $T_{I,2}$;
determining whether a current control state is a first control state or a second control state;
selecting the first tone signal $T_{I,1}$ as a chosen signal if the current control state is determined to be the first control state;
generating an output bandwidth signal $G_{I+1}$ such that an output frequency of the output bandwidth signal $G_{I+1}$ is equal to a sum of an input frequency of the input bandwidth signal $G_I$ and a first tone frequency of the first tone signal $T_{I,1}$, if the current control state is determined to be the first control state;
selecting the second tone signal $T_{I,2}$ as the chosen signal if the current control state is determined to be the second control state; and
generating the output bandwidth signal $G_{I+1}$ such that the output frequency of the output bandwidth signal $G_{I+1}$ is equal to a difference between a second tone frequency of the second tone signal $T_{I,2}$ and the input frequency of the input bandwidth signal $G_I$, if the current control state is determined to be the first control state;
determining if additional multiplier operations are required;
incrementing I by 1 and repeating the performing of the $(I+1)^{th}$ multiplier operation and the determining if additional multiplier operations are required if additional multiplier operations are required; and
setting the output bandwidth signal $G_{I+1}$ as an operational output if no additional multiplier operations are required.

* * * * *